(12) United States Patent
Zhang et al.

(10) Patent No.: US 7,964,443 B2
(45) Date of Patent: Jun. 21, 2011

(54) METHOD OF FORMING A CROSSED WIRE MOLECULAR DEVICE INCLUDING A SELF-ASSEMBLED MOLECULAR LAYER

(75) Inventors: Sean X. Zhang, Sunnyvale, CA (US); Sui-Hing Leung, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/727,065

(22) Filed: Mar. 18, 2010

(65) Prior Publication Data
US 2010/0171114 A1    Jul. 8, 2010

Related U.S. Application Data

(62) Division of application No. 10/881,473, filed on Jun. 30, 2004, now Pat. No. 7,709,290.

(51) Int. Cl.
*H01L 51/40* (2006.01)
(52) U.S. Cl. .............. 438/99; 257/40; 257/E51.024; 257/E51.027
(58) Field of Classification Search .......... 438/99; 257/40, E51.024, E51.027
See application file for complete search history.

(56) References Cited

U.S. PATENT DOCUMENTS

| 6,128,214 A | 10/2000 | Kuekes |
| 6,451,942 B1 | 9/2002 | Li |
| 6,459,095 B1 | 10/2002 | Heath |
| 6,562,398 B1 | 5/2003 | Braach-Maksvytis |
| 6,674,932 B1 | 1/2004 | Zhang |
| 2002/0176276 A1 | 11/2002 | Zhang |
| 2005/0001317 A1 | 1/2005 | Ganapathiraman |

FOREIGN PATENT DOCUMENTS

| EP | 0268370 | 5/1988 |
| EP | 0506368 | 9/1992 |
| EP | 1355323 | 10/2003 |
| WO | 02/095810 A1 | 11/2002 |
| WO | 2006/005016 | 1/2006 |

OTHER PUBLICATIONS

International Search Report for S.N. PCT/US2005/023323, dated Jul. 6, 2006 (5 pages).

*Primary Examiner* — Matthew C Landau
*Assistant Examiner* — Colleen E Snow

(57) ABSTRACT

A method of forming a crossed wire molecule device comprising a plurality of bottom electrodes, a plurality of top electrodes crossing the bottom electrodes at a non-zero angle, and a self-assembled molecular film chemically bonded to a surface of each of the bottom electrodes is provided. The self-assembled molecular film includes one or more defect sites and a plurality of active device molecules, each of the plurality of active device molecules including a molecular switching moiety having a self-assembling connecting group at one end of the moiety and a linking group at an opposed end of the moiety. The polymeric material chemically bonds to at least some of the linking groups of the plurality of active device molecules, causing the formation of the self-assembled molecular layer covering the plurality of active device molecules and the defect site(s). A molecular switching device is also provided.

22 Claims, 5 Drawing Sheets

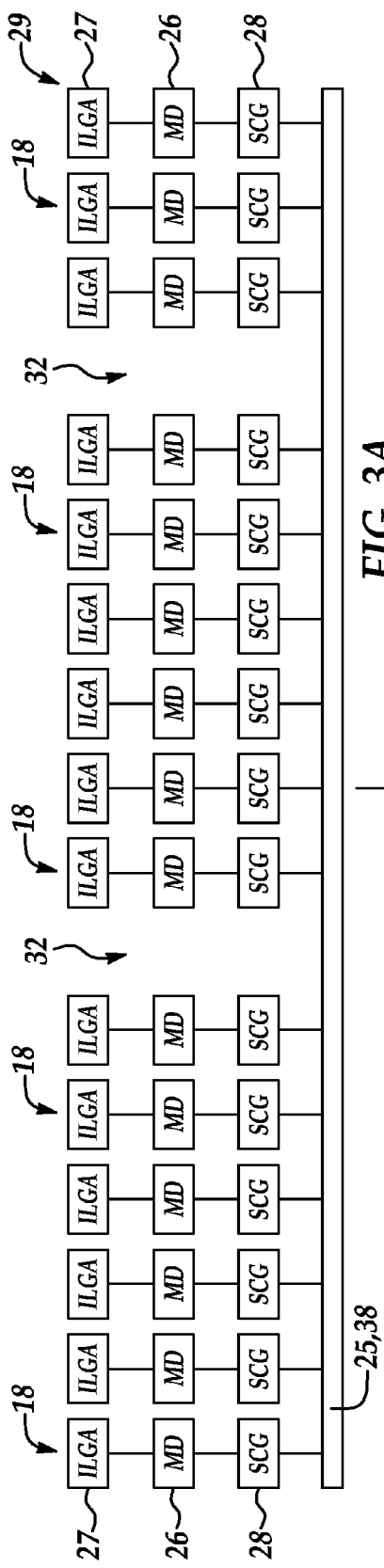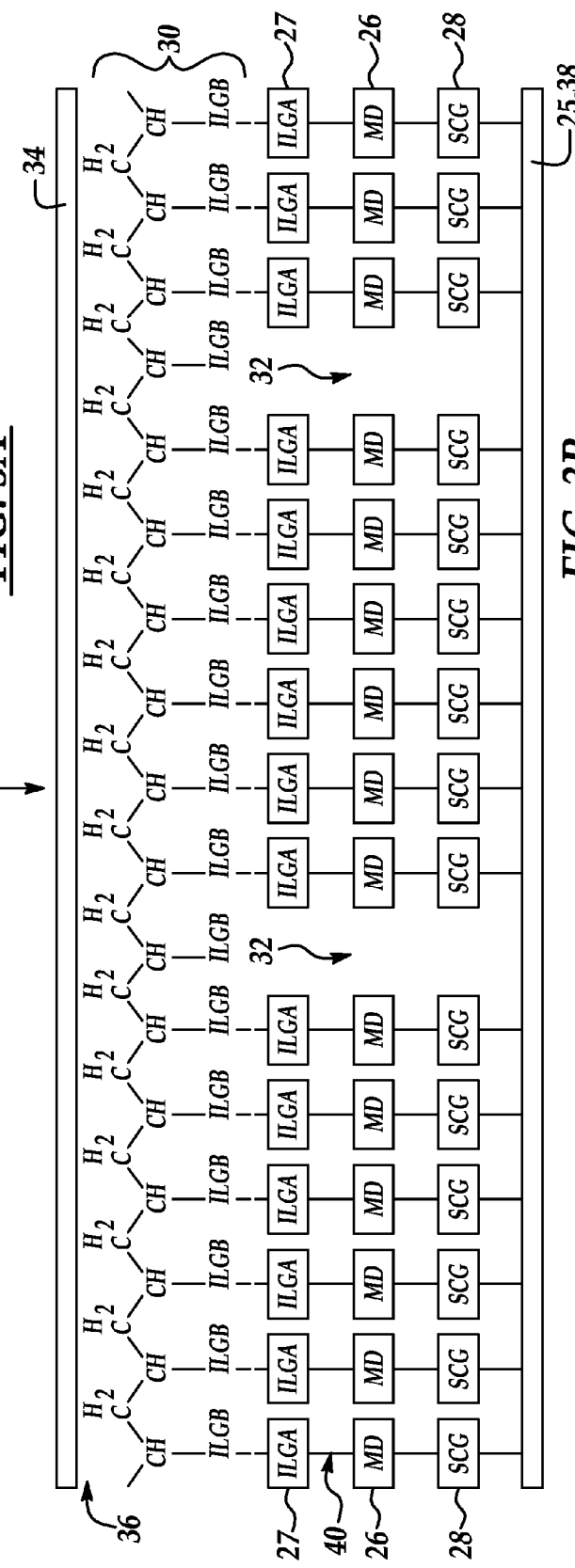

METHOD OF FORMING A CROSSED WIRE MOLECULAR DEVICE INCLUDING A SELF-ASSEMBLED MOLECULAR LAYER

CROSS-REFERENCE TO RELATED APPLICATION

The present application is a divisional application of application Ser. No. 10/881,473, filed Jun. 30, 2004, now U.S. Pat. No. 7,709,290 the contents of which are incorporated by reference herein.

BACKGROUND

The present invention relates generally to molecular electronics, and more particularly to the fabrication of self-assembled molecular layers.

Molecular devices comprising two electrodes (for example, a bottom electrode and a top electrode) and a molecular switching layer/film at the junction of the two electrodes are known. Such devices may be useful, for example, in the fabrication of devices based on electrical switching, such as molecular wire crossbar interconnects for signal routing and communications, molecular wire crossbar memory, molecular wire crossbar logic employing programmable logic arrays, multiplexers/demultiplexers for molecular wire crossbar networks, molecular wire transistors, and the like. Such devices may further be useful, for example, in the fabrication of devices based on optical switching, such as displays, electronic books, rewritable media, electrically tunable optical lenses, electrically controlled tinting for windows and mirrors, optical crossbar switches (for example, for routing signals from one of many incoming channels to one of many outgoing channels), and the like.

Typically, the molecular switching layer/film comprises an organic molecule that, in the presence of an electrical (E) field, switches between two or more energetic states, such as by an electro-chemical oxidation/reduction (redox) reaction or by a change in the band gap of the molecule induced by the applied E-field.

It is important to form a good electrical contact between the electrode and the molecular switching layer in order to fabricate operative molecular devices. Molecules with special chemical end groups are able to form direct chemical bonds with metal/semiconductor electrodes to form a self-assembled monolayer/molecular layer (SAM), which may have a good electrical contact with an electrode(s). However, this self-assembled molecular layer formed on the surface of the electrode may generally be prone to a high density of defects. If a second electrode is formed on the molecular layer, then an electrical short may occur between the first and second electrode through the defects in the self-assembled molecular layer.

As such, there is a need for providing a high density molecular switching layer on an electrode(s), which layer also bonds well with the electrode. Further, there is a need for reducing and/or substantially eliminating electrical short circuit problems potentially associated with molecular electronic devices.

SUMMARY

Embodiment(s) of the present invention substantially solve the drawbacks enumerated above by providing a method for forming a self-assembled molecular layer. The method includes chemically bonding a polymeric material to a self-assembled molecular film chemically bonded to a surface of a substrate. The self-assembled molecular film includes one or more defect sites and a plurality of active device molecules, each of the plurality of active device molecules including a molecular switching moiety having a self-assembling connecting group at one end of the moiety and a linking group at an opposed end of the moiety. The polymeric material chemically bonds to at least some of the linking groups of the plurality of active device molecules, thereby forming the self-assembled molecular layer covering a plurality of active device molecules and the one or more defect sites.

BRIEF DESCRIPTION OF THE DRAWINGS

Objects, features and advantages of embodiments of the present invention will become apparent by reference to the following detailed description and drawings, in which like reference numerals correspond to similar, though not necessarily identical components. For the sake of brevity, reference numerals having a previously described function may not necessarily be described in connection with subsequent drawings in which they appear.

FIGS. 3A and 3B are schematic flow diagrams depicting an embodiment of a method of forming a self-assembled molecular layer;

DETAILED DESCRIPTION

Embodiments of the present invention advantageously use a novel concept of providing a self-assembled molecular layer/monolayer, which may act as a protective layer. This novel concept takes advantage of the advantageous qualities of self-assembly techniques (e.g. good electrical contact due to chemical bonding) while substantially eliminating problems that may, in some instances, be associated with these techniques.

The method according to embodiments of the present invention provides orienting a self-assembled molecular layer that may be dense and highly uniform on a molecular film such that the self-assembled molecular layer acts as a barrier between the molecular film and any subsequently deposited metal.

Figure 1A:
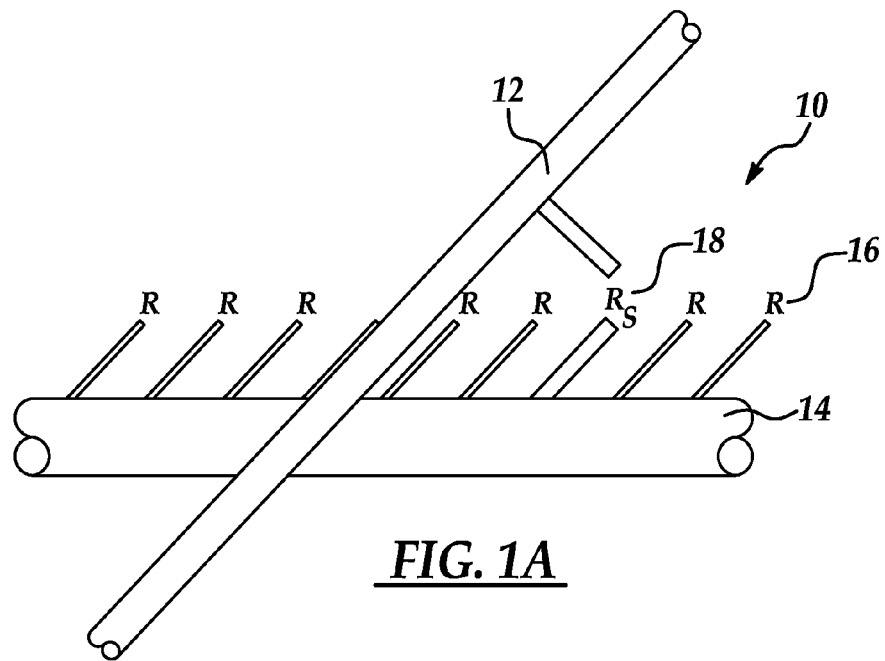
FIG. 1A is a schematic representation of two crossed wires, with at least one molecule at the intersection of the two wires.
Figure 1B:
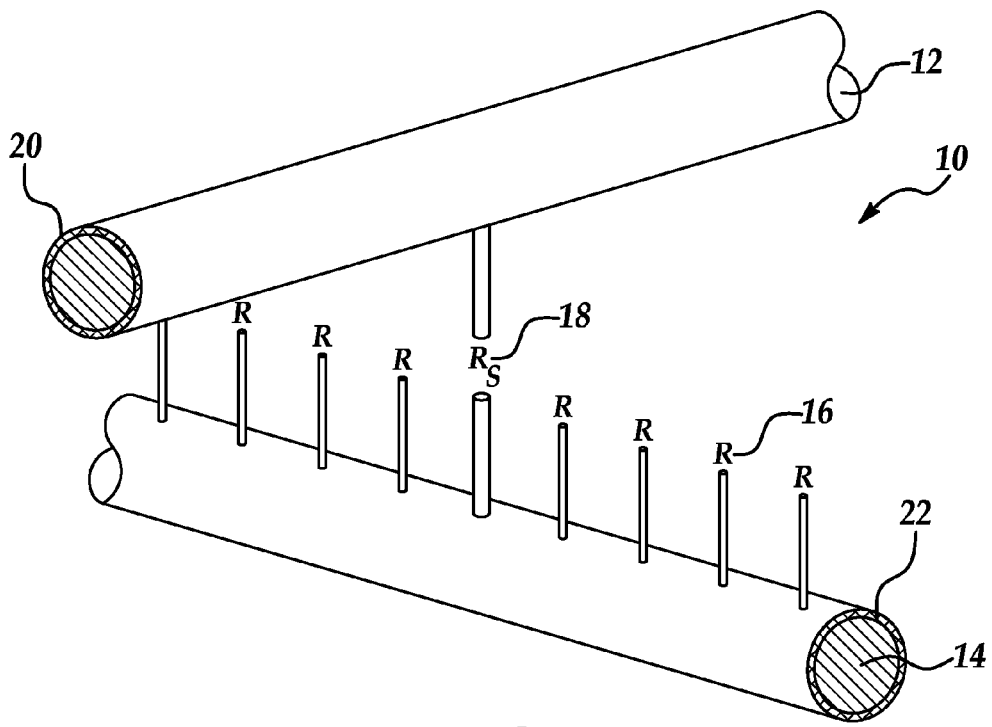
FIG. 1B is a perspective elevational view, depicting the crossed-wire device shown in FIG. 1A.

Referring now to FIGS. 1A-1B, a crossed wire switching device 10 includes two wires 12, 14, each either a metal and/or semiconductor wire, that are crossed at some substantially non-zero angle. Disposed between wires 12, 14 is a layer 16 of molecules and/or molecular compounds, denoted R. The particular molecules (active device molecules) 18 that are sandwiched at the intersection (also interchangeably referred to herein as a junction) of the two wires 12, 14 are identified as switch molecules $R_S$.

There are generally two primary methods of operating such switches 10, depending on the nature of the switch molecules 18. The molecular switching layer 16 includes a switch molecule 18 (for example, an organic molecule) that, in the presence of an electrical (E) field, switches between two or more energetic states, such as by an electrochemical oxidation/reduction (redox) reaction or by a change in the band gap of the molecule induced by the applied E-field.

In the former case, when an appropriate voltage is applied across the wires 12, 14, the switch molecules $R_S$ are either oxidized or reduced. When a molecule is oxidized (reduced), then a second species is reduced (oxidized) so that charge is balanced. These two species are then called a redox pair. One example of this device would be for one molecule to be reduced, and then a second molecule (the other half of the redox pair) would be oxidized. In another example, a molecule is reduced, and one of the wires 12, 14 is oxidized. In a third example, a molecule is oxidized, and one of the wires 12, 14 is reduced. In a fourth example, one wire 12, 14 is oxidized, and an oxide associated with the other wire 14, 12 is reduced. In such cases, oxidation or reduction may affect the tunneling distance or the tunneling barrier height between the two wires, thereby exponentially altering the rate of charge transport across the wire junction, and serving as the basis for a switch. Examples of molecules 18 that exhibit such redox behavior include rotaxanes, pseudo-rotaxanes, and catenanes; see, e.g., U.S. Pat. No. 6,459,095, entitled "Chemically Synthesized and Assembled Electronic Devices", issued Oct. 1, 2002, to James R. Heath et al, the disclosure of which is incorporated herein by reference in its entirety.

Further, the wires 12, 14 may be modulation-doped by coating their surfaces with appropriate molecules—either electron-withdrawing groups (Lewis acids, such as boron trifluoride ($BF_3$)) or electron-donating groups (Lewis bases, such as alkylamines) to make them p-type or n-type conductors, respectively. FIG. 1B depicts a coating 20 on wire 12 and a coating 22 on wire 14. The coatings 20, 22 may be modulation-doping coatings, tunneling barriers (e.g., oxides), or other nano-scale functionally suitable materials. Alternatively, the wires 12, 14 themselves may be coated with one or more R species 16, and where the wires cross, $R_s$ 18 is formed. Or yet alternatively, the wires 12, 14 may be coated with molecular species 20, 22, respectively, for example, that enable one or both wires 12, 14 to be suspended to form colloidal suspensions, as discussed below. Details of such coatings are provided in above-referenced U.S. Pat. No. 6,459,095.

In the latter case, examples of molecule 18 based on field induced changes include E-field induced band gap changes, such as disclosed and claimed in patent application Ser. No. 09/823,195, filed Mar. 29, 2001, published as Publication No. 2002/0176276 on Nov. 28, 2002, which application is incorporated herein by reference in its entirety. Examples of molecules used in the E-field induced band gap change approach include molecules that evidence molecular conformation change or an isomerization; change of extended conjugation via chemical bonding change to change the band gap; or molecular folding or stretching.

Changing of extended conjugation via chemical bonding change to change the band gap may be accomplished in one of the following ways: charge separation or recombination accompanied by increasing or decreasing band localization; or change of extended conjugation via charge separation or recombination and π-bond breaking or formation.

The formation of micrometer scale and nanometer scale crossed wire switches 10 uses either a reduction-oxidation (redox) reaction to form an electrochemical cell or uses E-field induced band gap changes to form molecular switches. In either case, the molecular switches typically have two states, and may be either irreversibly switched from a first state to a second state or reversibly switched from a first state to a second state. In the latter case, there are two possible conditions: either the electric field may be removed after switching into a given state, and the molecule will remain in that state ("latched") until a reverse field is applied to switch the molecule back to its previous state; or removal of the electric field causes the molecule to revert to its previous state, and hence the field must be maintained in order to keep the molecule in the switched state until it is desired to switch the molecule to its previous state.

Color switch molecular analogs, particularly based on E-field induced band gap changes, are also known; see, e.g., U.S. application Ser. No. 09/844,862, filed Apr. 27, 2001.

Figure 2:
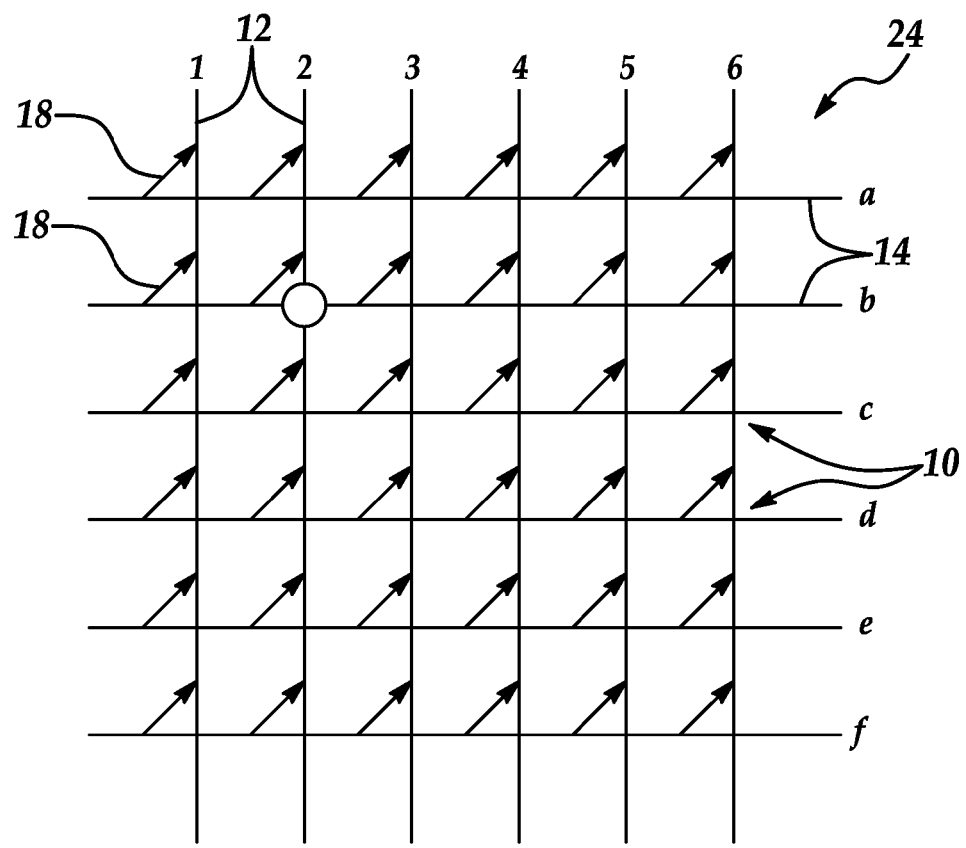
FIG. 2 is a schematic representation of a two-dimensional array of switches, depicting a 6×6 crossbar switch.

Referring now to FIG. 2, the switch 10 may be replicated in a two-dimensional array to form a plurality/array 24 of switches 10 to form a crossbar switch. FIG. 2 depicts a 6×6 array 24. However, it is to be understood that the embodiments herein are not to be limited to the particular number of elements, or switches 10, in the array 24. Access to a single point, e.g., 2b, is done by impressing voltage on wires 2 and b to cause a change in the state of the molecular species 18 at the junction thereof, as described above. Thus, access to each junction is readily available for configuring those that are pre-selected. Details of the operation of the crossbar switch array 24 are further discussed in U.S. Pat. No. 6,128,214, entitled "Molecular Wire Crossbar Memory", issued on Oct. 3, 2000, to Philip J. Kuekes et al., which is incorporated herein by reference in its entirety.

Referring now to FIGS. 3A and 3B, a method of forming a self-assembled molecular layer 30 includes chemically bonding one or more active device molecules 18 to a surface of a substrate 25 to form a self-assembled molecular film 29. Chemically bonding the active device molecules 18 to the substrate 25 may be accomplished by a self-assembled monolayer (SAM) process. Using this process, self-assembling connecting groups (SCG) 28 of the active device molecules 18 bond to the substrate 25 surface.

It is to be understood that the substrate 25 may be made of any suitable conductive or semi-conductive material. In an embodiment, the substrate 25 is a bottom electrode 38. It is to be understood that in an optical application, the substrate 25 may be a non-electrode material.

In an embodiment, the active device molecule 18 includes a switching moiety (MD) 26 having a linking group (ILGA) 27 and the previously mentioned self-assembling connecting group 28 at opposed ends thereof.

The molecular switching moiety 26 is an optically switchable molecular functional unit and/or an electrically switchable molecular functional unit. It is to be understood that the switching moiety 26 may be any suitable moiety, however, in an embodiment, the moiety 26 includes at least one of saturated hydrocarbons, unsaturated hydrocarbons, substituted hydrocarbons, heterocyclic systems, organometallic complex systems, and/or mixtures thereof.

In an embodiment, the switching moiety 26 includes a moiety that, in the presence of an electric field, undergoes oxidation/reduction, and/or experiences a band gap change. In one embodiment, the switching moiety 26 undergoes oxidation/reduction and includes at least one of rotaxanes, pseudo-rotaxanes, catenanes, and mixtures thereof. An example of a switching moiety 26 that undergoes a band gap change in the presence of an external electrical field is described in U.S. Pat. No. 6,674,932 granted to Zhang et al. on Jan. 6, 2004, the specification of which is hereby incorporated herein by reference in its entirety.

The linking group 27 may be bonded to one end of the switching moiety 26 such that it is adapted to bond to the self-assembled molecular layer 30 (shown in FIG. 3B). It is to be understood that the linking group 27 may be, but is not limited to at least one of multivalent hetero atoms selected from the group consisting of C, N, O, S, and P; functional groups containing the hetero atoms and selected from the group consisting of $NH_2$, NH-alkyl, and NH-aryl; pyridine; heterocyclic compounds including at least one nitrogen atom; carboxylic acids; sulfuric acids; phosphoric acids; and/or mixtures thereof.

The self-assembling connecting group 28 may be bonded to the opposed end of the switching moiety 26, such that it is capable of bonding to the substrate 25 surface. Examples of suitable self-assembling connecting groups 28 include, but are not limited to at least one of multivalent hetero atoms selected from the group consisting of C, N, O, S, and P; functional groups containing the hetero atoms and selected from the group consisting of SH, S-acyl, S—S-alkyl, OH, $NH_2$, NH-alkyl, NH-aryl, NH-acyl; heterocyclic compounds; pyridine and derivatives thereof (a non-limitative example of which includes substituted pyridines, such as N,N-dimethylamino pyridine); carboxylic acids; derivatives thereof (non-limitative examples of which include carboxylic esters, amides, nitriles, and/or the like); amines; alkyl amines; and mixtures thereof.

Upon bonding the active device molecules 18 to the substrate 25 via a SAM process, the self-assembled molecular film 29 is formed. Due in part to the SAM process, the self-assembled molecular film 29 may be a loosely packed monolayer film that contains one or more defect sites 32 that may cause short circuits when electrical contacts (e.g. top electrode(s) 34) are deposited on the film 29.

Referring now to FIG. 3B, the self-assembled molecular layer 30 is formed on the self-assembled molecular film 29 such that it covers the plurality of active device molecules 18 and the one or more defect site(s) 32. It is believed, without being bound to any theory, that the self-assembled molecular layer 30 is adapted to protect the plurality of active device molecules 18 and the at least one defect site 32 from potential deleterious effects (e.g. metal penetration, electrical shorting, and undesirable chemical reaction(s)) associated with the addition of a metal layer (e.g. top electrode(s) 34).

The self-assembled molecular layer 30 may be formed by chemically bonding a conductive or non-conductive polymeric material within a solution to at least some of the linking groups 27 of the active device molecules 18 in the self-assembled molecular film 29.

It is to be understood that chemically bonding the polymeric material to linking groups 27 may be accomplished by ionic bonding, covalent bonding (e.g. substitution reaction) and/or coordination bonding (e.g. metal complex formation).

In an embodiment where ionic bonding is used to form the self-assembled molecular layer 30, the self-assembled molecular film 29 bonded to the substrate 25 is immersed into a solution containing the polymeric material. It is to be understood that any suitable polymeric material in solution may be used. In an embodiment, the polymeric material solution contains at least one of polyvinylamines, polyvinylpyridines, amino substituted polyacrylates, polyacrylic acids, polymethacrylic acids, polystyrene sulfuric acids, and/or mixtures thereof. It is to be further understood that, upon immersion into the solution, an acid-base reaction (ionization reaction) takes place between the polymeric material and the linking group 27. Without being bound to any theory, it is believed that, due in part to the exothermic acid-base reaction, the polymeric material may self-organize to achieve a substantially stable and low energy state and to form the substantially dense and highly uniform self-assembled molecular layer 30. When using ionic bonding, it is contemplated that the linking groups 27 of the active device molecules 18 and functional groups ILGB of the polymeric material are selected so that ionic bonds form between the two groups.

It is to be understood that in an embodiment utilizing ionic bonding, the polymeric material may behave as if it were cross-linked, thus the interlocking ionic molecular layer 30 may substantially improve the structural rigidity, and may advantageously enhance the reliability and/or durability of the device 10 in which the molecular layer 30 is used.

In an embodiment employing a non-conductive polymeric material and electrical switching, the final self-assembled molecular layer 30 may have a thickness of less than about 2 nm so that electronic tunneling may occur. In a further embodiment, the thickness is less than about 1 nm. In an embodiment employing a non-conductive polymeric material and optical switching, the final self-assembled molecular layer 30 may have a thickness that is greater than about 2 nm. In this embodiment, the thickness of the self assembled molecular layer 30 may range between about 2 nm and about 10 μm.

Further, an embodiment of the method may optionally include the step of depositing a metal layer (e.g. top electrode 34) on the self-assembled molecular layer 30. Any suitable metal layer (non-limitative examples of which include titanium, aluminum, platinum, alloys thereof, mixtures thereof, and/or the like) or top electrode 34 may be selected. It is contemplated as being within the purview of the present invention that any suitable deposition technique may be used to form the top electrode 34, including, but not limited to an evaporative metal deposition process, a thermal metal deposition process, a sputtering process, and/or the like.

It is believed that, without being bound to any theory, the substantially dense and uniform self-assembled molecular layer 30 advantageously substantially prevents metal penetration during evaporative metal deposition when the top electrode 34 is formed or when subsequent metal diffusion occurs. The self-assembled molecular layer 30 may also advantageously prevent a chemical reaction between the active device molecules 18 and the metal layer/top electrode 34, and/or other environmental contaminants.

In a further embodiment, chemical bonding may be formed in an interface 36 between the top electrode 34 and the self-assembled molecular layer 30 during the deposition of the top electrode 34 via a thermal metal deposition process.

It is to be understood that in this embodiment, the self-assembled molecular layer 30 may become metallized. A metallized self-assembled molecular layer 30 may advantageously enhance the electrical conductivity, reduce and/or eliminate the possibility of interfacial charge trapping, and improve the mechanical integrity of the top electrode 34.

Figure 4A:
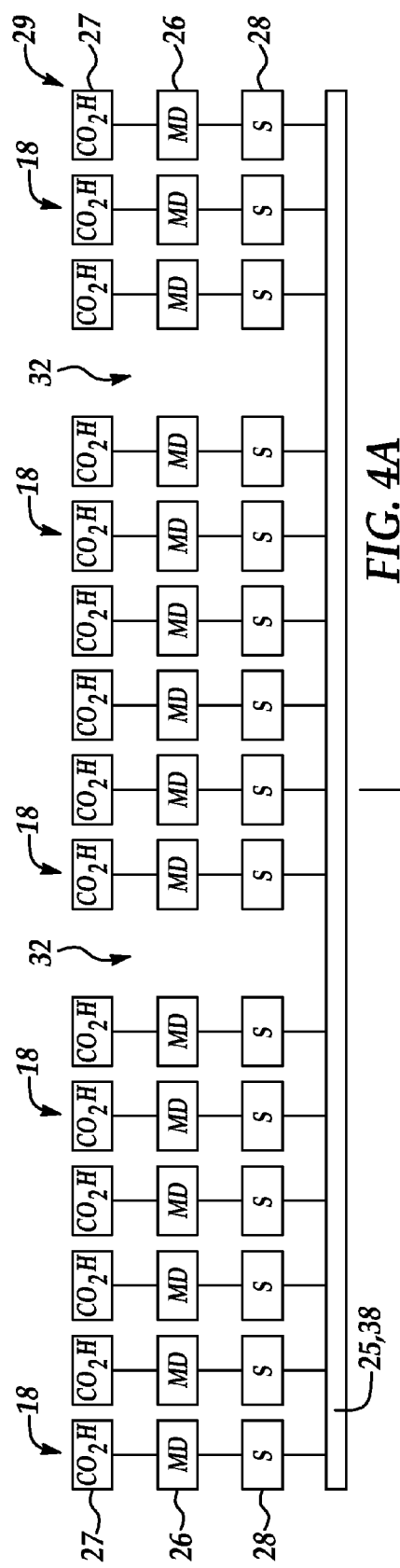
FIGS. 4A and 4B is similar to FIG. 3, but depicts an alternate embodiment of a method of the present invention.
Figure 4B:
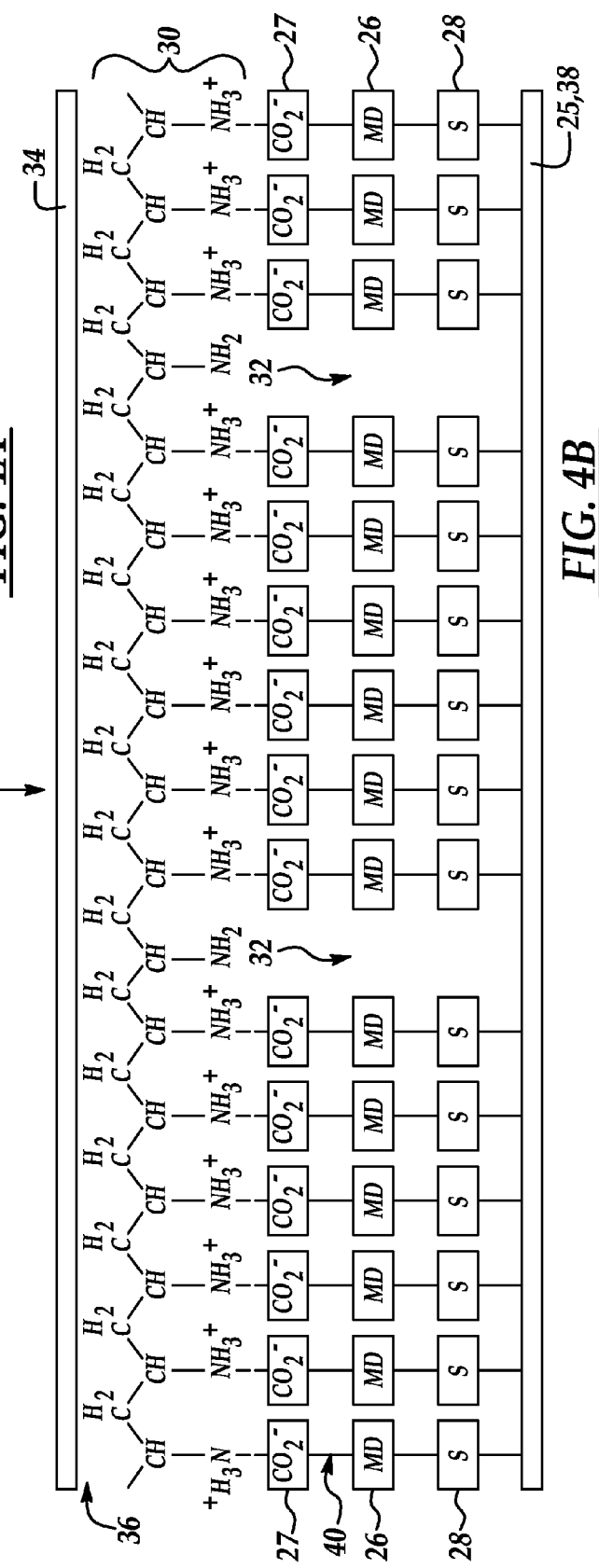

A non-limitative embodiment of the method is shown in FIGS. 4A and 4B. In this embodiment, the active device molecules 18 have thiol (S) as the self-assembling connecting group 28, and COOH as the linking group 27. The active device molecules 18 are covalently bonded via the connecting group(s) 28 to a substrate 25 (non-limitative examples of which include bottom electrodes 38, gold, platinum, silver, copper, alloys thereof, mixtures thereof, or the like) to form the self-assembled molecular film 29. As depicted in FIG. 4A, at least one defect site 32 is present in the film 29.

The arrow between FIGS. 4A and 4B represents immersing the film 29 bonded to the substrate 25 into a diluted (about 0.1% or less) polyvinylamine solution. The amines of the polymer solution ionically bond with the COOH linking groups 27 of the active device molecules 18 in the film 29. The bonding of these groups forms the self-assembled molecular layer 30.

A metal layer or top electrode 34 may then be deposited/formed on the self-assembled molecular layer 30.

Figure 5A:
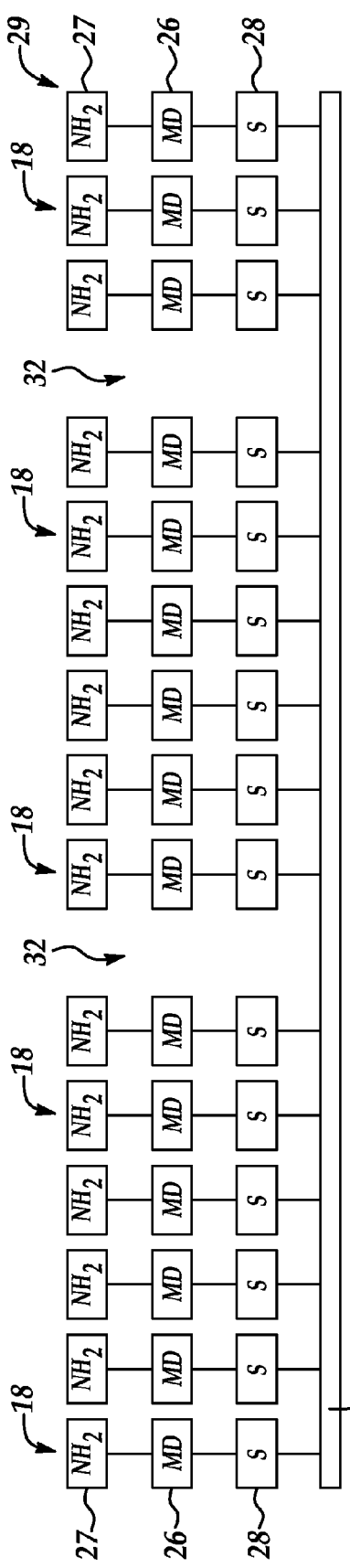
FIGS. 5A and 5B is similar to FIG. 3, but depicts a further alternate embodiment of a method of the present invention.
Figure 5B:
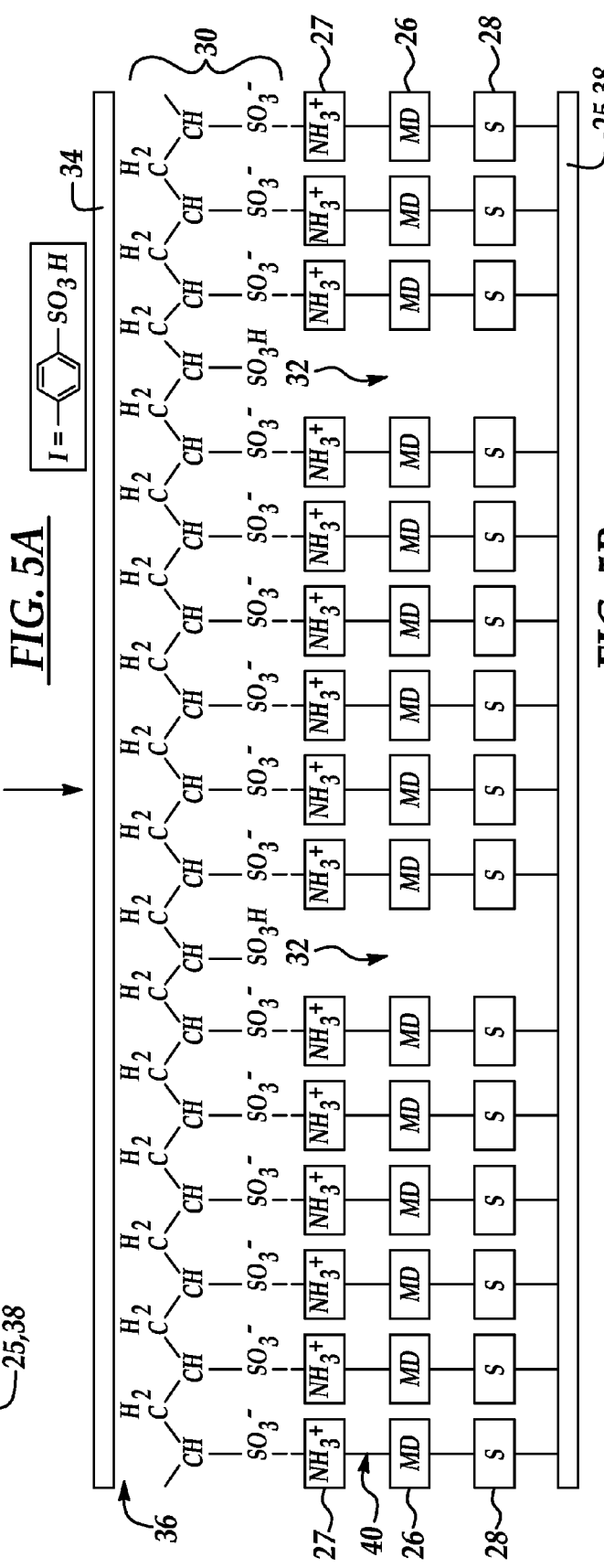

A second non-limitative embodiment of the method is shown in FIGS. 5A and 5B. In this embodiment, the active device molecules 18 have thiol (S) as the self-assembling connecting group 28, and $NH_2$ as the linking group 27. The active device molecules 18 are covalently bonded via the connecting group(s) 28 to a substrate 25 (non-limitative examples of which include bottom electrodes 38, gold, platinum, silver, copper, alloys thereof, mixtures thereof, and/or the like) to form the self-assembled molecular film 29. As depicted in FIG. 5A, at least one defect site 32 is present in the film 29.

The arrow between FIGS. 5A and 5B represents immersing the film 29 bonded to the substrate 25 into a diluted (about 0.1% or less) polystyrene sulfuric acid solution. The phenyl sulfuric acid groups of the polymer solution ionically bond with the $NH_2$ linking groups 27 of the active device molecules 18 in the film 29. The bonding of these groups forms the self-assembled molecular layer 30.

A metal layer or top electrode 34 may then be deposited on the self-assembled molecular layer 30.

An embodiment of a plurality of molecules (self-assembled molecules) 40 includes a plurality of active device molecules 18, each having a switching moiety 26 with a linking group 27 and a self-assembling connecting group 28 at opposed ends of the moiety 26. A polymeric material layer as previously described is chemically bonded to at least some of the linking groups 27 of the active device molecules 18 to form the self-assembled molecular layer 30. It is to be understood that the molecule(s) 40 may be used in a variety of applications, including, but not limited to a molecular switching device 10.

An embodiment of a crossed wire molecular device 24 includes a plurality of bottom electrodes 38, a plurality of top electrodes 34 crossing the bottom electrodes 38 at a non-zero angle, a self-assembled molecular film 29 formed from a plurality of active device molecules 18 bonded to the bottom electrode 38, and a self-assembled molecular layer 30 bonded to the self-assembled molecular film 29. The self-assembled molecular layer 30 is bonded to the self-assembled molecular film 29 such that the active device molecules 18 and the defect site(s) 32 are covered. The film 29 and layer 30 are operatively disposed in at least one junction formed where one electrode 34, 38 crosses another electrode 38, 34.

A non-limitative embodiment of a method of forming the crossed wire molecular device 24 is as follows. The self-assembled molecular film 29 is chemically bonded to the surface of at least one of the plurality of bottom electrodes 38. A polymeric material within a solution is chemically bonded to at least some of the linking groups 27 of the active device molecules 18 to form the self-assembled molecular layer 30 covering the plurality of active device molecules 18 and the one or more defect site(s) 32. The method may further include forming one of the plurality of top electrodes 34, crossing the one of the plurality of bottom electrodes 38 at the non-zero angle, thereby forming the junction therebetween. The molecular film 29 and the molecular layer 30 are thereby operatively disposed at the junction.

While several embodiments have been described in detail, it will be apparent to those skilled in the art that the disclosed embodiments may be modified. Therefore, the foregoing description is to be considered exemplary rather than limiting.

What is claimed is:

1. A method of forming a crossed wire molecular device comprising a plurality of bottom electrodes, a plurality of top electrodes crossing the bottom electrodes at a non-zero angle, a self-assembled molecular film chemically bonded to a surface of each of the bottom electrodes, the self-assembled molecular film including at least one defect site and a plurality of active device molecules, each of the plurality of active device molecules including a molecular switching moiety having a self-assembling connecting group and a linking group at opposed ends thereof, and a self-assembled monolayer chemically bonded to the self-assembled molecular film, the self-assembled molecular film and the self-assembled monolayer operatively disposed in at least one junction formed where one electrode crosses another electrode, the method comprising the steps of:

chemically bonding the self-assembled molecular film to the surface of one of the plurality of bottom electrodes;

chemically bonding, via at least one of covalent bonding, ionic bonding, or coordination bonding, a polymeric material within a solution to at least some of the linking groups of the plurality of active device molecules, thereby forming the self-assembled monolayer covering the plurality of active device molecules and the at least one defect site; and forming one of the plurality of top electrodes, crossing the one of the plurality of bottom electrodes at the non-zero angle, thereby forming the at least one junction therebetween, wherein the self-assembled monolayer is chemically bonded on a surface of the one of the plurality of top electrodes.

2. The method as defined in claim 1 wherein chemically bonding the polymeric material is accomplished by immersing the self-assembled molecular film bonded to the surface of one of the plurality of bottom electrodes into a solution containing the polymeric material.

3. The method as defined in claim 1 wherein the solution containing the polymeric material comprises at least one of polyvinylamines, polyvinylpyridines, amino substituted polyacrylates, polyacrylic acids, polymethacrylic acids, polystyrene sulfuric acids, and mixtures thereof.

4. The method as defined in claim 1 wherein chemically bonding the polymeric material is accomplished by forming a metal complex formation.

5. The method as defined in claim 1 wherein the molecular switching moiety is at least one of an optically switchable molecular functional unit and an electrically switchable molecular functional unit.

6. The method as defined in claim 5 wherein the molecular switching moiety comprises at least one of saturated hydrocarbons, unsaturated hydrocarbons, substituted hydrocarbons, heterocyclic systems, organometallic complex systems, and mixtures thereof.

7. The method as defined in claim 1 wherein the linking group comprises at least one at least one of multivalent hetero atoms selected from the group consisting of C, N, O, S, and P; functional groups containing the hetero atoms and selected from the group consisting of $NH_2$, NH-alkyl, and NH-aryl; pyridine; heterocyclic compounds including at least one nitrogen atom; carboxylic acids; sulfuric acids; phosphoric acids; and mixtures thereof.

8. The method as defined in claim 1 wherein the self-assembling connecting group comprises at least one of multivalent hetero atoms selected from the group consisting of C, N, O, S, and P; functional groups containing the hetero atoms and selected from the group consisting of SH, S-acyl, S—S-alkyl, OH, $NH_2$, NH-alkyl, NH-aryl, NH-acyl; heterocyclic compounds; pyridine; substituted pyridines; carboxylic acids; carboxylic esters; amides; nitriles; amines; alkyl amines; and mixtures thereof.

9. The method as defined in claim 1 wherein the polymeric material is non-conductive and wherein the self-assembled monolayer has a thickness less than about 2 nm and is adapted to provide an electrically conductive path to the self-assembled molecular film.

10. The method as defined in claim 9 wherein the thickness is less than about 1 nm.

11. The method as defined in claim 9 wherein the self-assembled monolayer is adapted to protect the plurality of active device molecules and the at least one defect site.

12. A method of forming a crossed wire molecular device comprising a plurality of bottom electrodes, a plurality of top electrodes crossing the bottom electrodes at a non-zero angle, a self-assembled molecular film chemically bonded to a surface of each of the bottom electrodes, the self-assembled molecular film including at least one defect site and a plurality of active device molecules, each of the plurality of active device molecules including a molecular switching moiety having a self-assembling connecting group and a linking group at opposed ends thereof, and a self-assembled molecular layer chemically bonded to the self-assembled molecular film, the self-assembled molecular film and the self-assembled molecular layer operatively disposed in at least one junction formed where one electrode crosses another electrode, the method comprising the steps of:

chemically bonding the self-assembled molecular film to the surface of one of the plurality of bottom electrodes;

chemically bonding a polymeric material within a solution to at least some of the linking groups of the plurality of active device molecules, thereby forming the self-assembled molecular layer covering the plurality of active device molecules and the at least one defect site; and forming one of the plurality of top electrodes, crossing the one of the plurality of bottom electrodes at the non-zero angle, thereby forming the at least one junction therebetween, wherein the self-assembled molecular layer is chemically bonded on a surface of the one of the plurality of top electrodes;

wherein chemically bonding the polymeric material is accomplished by a substitution reaction.

13. A method of forming a crossed wire molecular device comprising a plurality of bottom electrodes, a plurality of top electrodes crossing the bottom electrodes at a non-zero angle, a self-assembled molecular film chemically bonded to a surface of each of the bottom electrodes, the self-assembled molecular film including at least one defect site and a plurality of active device molecules, each of the plurality of active device molecules including a molecular switching moiety having a self-assembling connecting group and a linking group at opposed ends thereof, and a self-assembled molecular layer chemically bonded to the self-assembled molecular film, the self-assembled molecular film and the self-assembled molecular layer operatively disposed in at least one junction formed where one electrode crosses another electrode, the method comprising the steps of:

chemically bonding the self-assembled molecular film to the surface of one of the plurality of bottom electrodes;

chemically bonding a polymeric material within a solution to at least some of the linking groups of the plurality of active device molecules, thereby forming the self-assembled molecular layer covering the plurality of active device molecules and the at least one defect site; and forming one of the plurality of top electrodes, crossing the one of the plurality of bottom electrodes at the non-zero angle, thereby forming the at least one junction therebetween, wherein the self-assembled molecular layer is chemically bonded on a surface of the one of the plurality of top electrodes;

wherein during the step of forming one of the plurality of top electrodes, the self-assembled molecular layer becomes metallized.

14. A molecular switching device, comprising:

at least one bottom electrode;

at least one top electrode, the top electrode crossing the bottom electrode at a non-zero angle, thereby forming a junction;

a plurality of self-assembled molecules operatively disposed in the junction, the plurality of self-assembled molecules including:

a plurality of active device molecules, each of the active device molecules including:

a switching moiety;

a self-assembling connecting group at one end of the switching moiety; and a linking group at an opposed end of the switching moiety;

at least one defect site disposed between the plurality of active device molecules; and a self-assembled monolayer chemically bonded via at least one of covalent bonding, ionic bonding, or coordination bonding to the plurality of active device molecules via at least some of the linking groups and chemically bonded on a surface of the at least one top electrode.

15. The molecular switching device as defined in claim 14 wherein the switching moiety is at least one of an optically switchable molecular functional unit and an electrically switchable molecular functional unit.

16. The molecular switching device as defined in claim 15 wherein the switching moiety comprises at least one of saturated hydrocarbons, unsaturated hydrocarbons, substituted hydrocarbons, heterocyclic systems, organometallic complex systems, and mixtures thereof.

17. The molecular switching device as defined in claim 14 wherein the linking group comprises at least one at least one of multivalent hetero atoms selected from the group consisting of C, N, O, S, and P; functional groups containing the hetero atoms and selected from the group consisting of $NH_2$, NH-alkyl, and NH-aryl; pyridine; heterocyclic compounds including at least one nitrogen atom; carboxylic acids; sulfuric acids; phosphoric acids; and mixtures thereof.

18. The molecular switching device as defined in claim 14 wherein the self-assembling connecting group comprises at least one of multivalent hetero atoms selected from the group consisting of C, N, O, S, and P; functional groups containing the hetero atoms and selected from the group consisting of SH, S-acyl, S—S-alkyl, OH, $NH_2$, NH-alkyl, NH-aryl, NH-acyl; heterocyclic compounds; pyridine; substituted pyridines; carboxylic acids; carboxylic esters; amides; nitriles; amines; alkyl amines; and mixtures thereof.

19. The molecular switching device as defined in claim 14 wherein the self-assembled monolayer comprises at least one of a non-conductive polymer, a conductive polymer, and mixtures thereof.

20. The molecular switching device as defined in claim 19 wherein the self-assembled monolayer comprises a non-conductive polymer, has a thickness less than about 2 nm, and is adapted to provide an electrically conductive path to the plurality of self-assembled molecules.

21. The molecular switching device as defined in claim 14 wherein the self-assembled monolayer comprises at least one of polyvinylamines, polyvinylpyridines, amino substituted polyacrylates, polyacrylic acids, polymethacrylic acids, polystyrene sulfuric acids, and mixtures thereof.

22. The molecular switching device as defined in claim 14 wherein the self-assembled monolayer is adapted to protect the at least one defect site.

* * * * *

UNITED STATES PATENT AND TRADEMARK OFFICE
CERTIFICATE OF CORRECTION

PATENT NO. : 7,964,443 B2
APPLICATION NO. : 12/727065
DATED : June 21, 2011
INVENTOR(S) : Sean X. Zhang et al.

It is certified that error appears in the above-identified patent and that said Letters Patent is hereby corrected as shown below:

In column 8, line 32, in Claim 7, after "one" delete "at least one".

In column 10, line 23, in Claim 17, after "one" delete "at least one".

Signed and Sealed this
Sixth Day of December, 2011

David J. Kappos
*Director of the United States Patent and Trademark Office*